United States Patent [19]

Lee et al.

[11] Patent Number: 4,779,094
[45] Date of Patent: Oct. 18, 1988

[54] APPARATUS FOR REMOTELY DETERMINING THE ANGULAR ORIENTATION, SPEED AND/OR DIRECTION OF ROTARY OBJECTS

[76] Inventors: Doo S. Lee, 26-35 Koosan-dong, Eunpyoung-ku, Seoul; Chae T. Lim, 794-2 Yeoksam-dong; Dong W. Choi, 26-301 Wooseoung Apt., Jansilbon-dong, both of Kangnam-ku, Seoul; Hyoung J. Lee, 26-35 Koosan-dong, Eunpyoung-ku, Seoul, all of Rep. of Korea

[21] Appl. No.: 933,178

[22] Filed: Nov. 21, 1986

[30] Foreign Application Priority Data

Nov. 23, 1985 [KR] Rep. of Korea ............... 8814
Dec. 30, 1985 [KR] Rep. of Korea ............. 10013

[51] Int. Cl.$^4$ ............................................. G08C 19/10
[52] U.S. Cl. ............................... 340/870.37; 324/61 R
[58] Field of Search .......... 340/870.37, 347 P, 365 S; 324/61 R; 250/231 SE

[56] References Cited

U.S. PATENT DOCUMENTS

| | | | |
|---|---|---|---|
| 3,198,937 | 8/1965 | Wooster | 340/347 P |
| 3,766,544 | 10/1973 | Batz | 340/870.37 |
| 3,815,126 | 6/1974 | Batz | 340/347 P |
| 4,007,454 | 2/1977 | Cain et al. | |
| 4,238,782 | 12/1980 | Ogasawara et al. | 340/870.37 |
| 4,405,917 | 9/1983 | Chai | 340/365 S |
| 4,414,538 | 11/1983 | Schnizlein | 340/365 S |
| 4,429,308 | 1/1984 | Shankle | |
| 4,433,332 | 2/1984 | Wason | 340/870.37 |
| 4,471,450 | 9/1984 | Arnason et al. | 340/870.37 |
| 4,631,539 | 12/1986 | Sanders et al. | 340/347 P |

FOREIGN PATENT DOCUMENTS 2118720 11/1983 United Kingdom ........... 340/870.37

*Primary Examiner*—John W. Caldwell, Sr.
*Assistant Examiner*—Alvin Oberley
*Attorney, Agent, or Firm*—Nixon & Vanderhye

[57] ABSTRACT

A circular array of equally spaced, identical stationary electrodes are arranged about the center of the array and a rotary electrode is substantially arranged on a surface of the rotary member to be monitored in such a manner that M among N stationary electrodes have a maximum capacitance by being in confronting relationship to the rotary electrode according to the angular position of the rotary member, a maximum capacitance is in proportion to $\theta$ which is the azimuthal angle of the radius as measured from the initial end of the stationary electrode. The angular position of rotary member is identified from the stationary electrodes which are in confronting relationship to rotary electrode and are identified by measuring the output signal owing to a maximum capacitance while scanning the stationary electrodes.

14 Claims, 14 Drawing Sheets

PRIOR ART

FIG.3A REFERENCE POINT
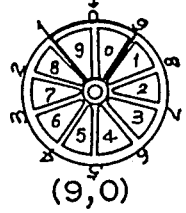
(9,0)
FIG.3B
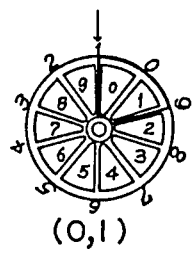
(0,1)
FIG.3C
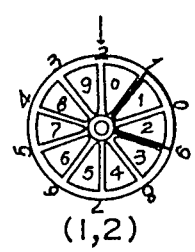
(1,2)
FIG.3D
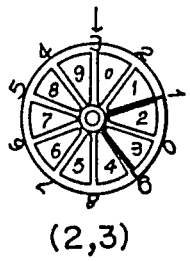
(2,3)
FIG.3E
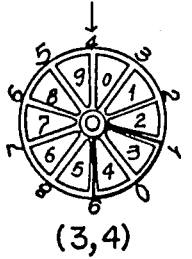
(3,4)
FIG.3F
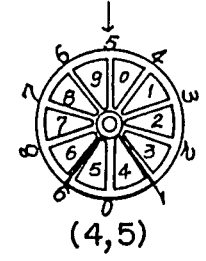
(4,5)
FIG.3G
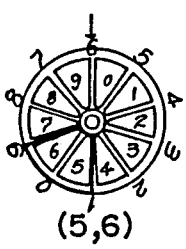
(5,6)
FIG.3H
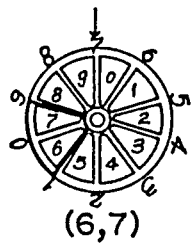
(6,7)
FIG.3I
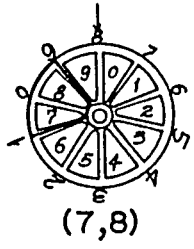
(7,8)
FIG.3J
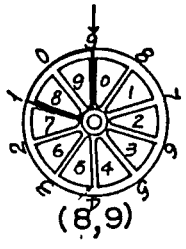
(8,9)

| COUNTER | ELECTRODE | | INDICATING |
|---|---|---|---|
| $Q_d Q_c Q_b Q_a$ | IN | OUT | NUMBER |
| 0 0 0 0 | 9 | 0 | 0 |
| 0 0 0 1 | 0 | 1 | 1 |
| 0 0 1 0 | 1 | 2 | 2 |
| 0 0 1 1 | 2 | 3 | 3 |
| 0 1 0 0 | 3 | 4 | 4 |
| 0 1 0 1 | 4 | 5 | 5 |
| 0 1 1 0 | 5 | 6 | 6 |
| 0 1 1 1 | 6 | 7 | 7 |
| 1 0 0 0 | 7 | 8 | 8 |
| 1 0 0 1 | 8 | 9 | 9 |

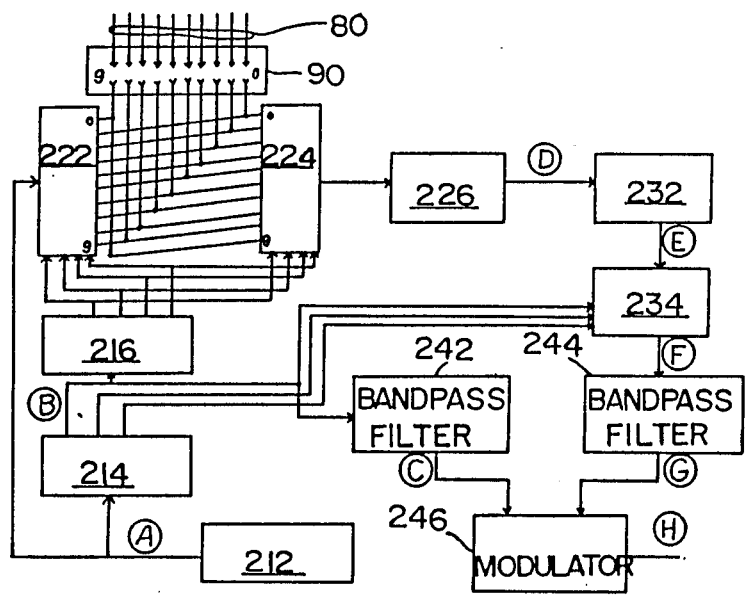

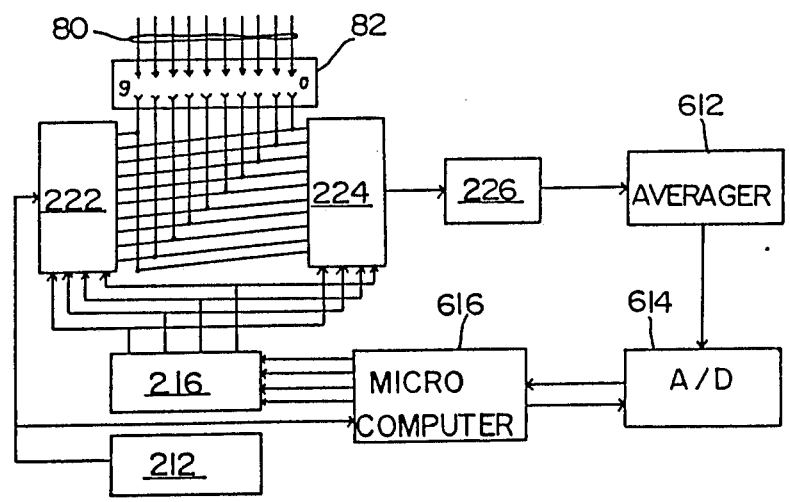
FIG. 7
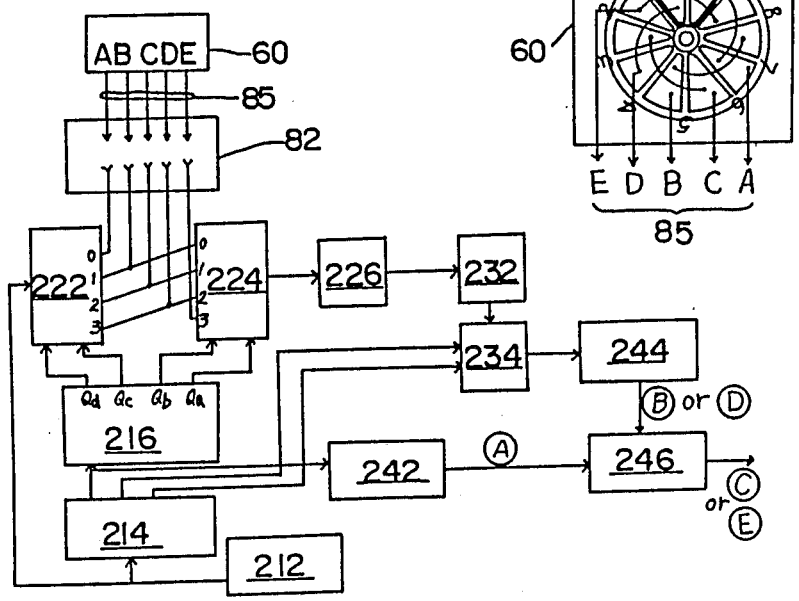
FIG. 8
FIG. 9

FIG. 10

| COUNTER 216 | ELECTRODE IN | ELECTRODE OUT | INDICATING NUMBER |
|---|---|---|---|
| 0000 | A | B | 3 |
| 0001 | A | C | 4 |
| 0010 | A | D | 0 |
| 0011 | A | E | 1 |
| 0100 | B | B | FOR REDUNDANCY CHECK |
| 0101 | B | C | 5 |
| 0110 | B | D | 6 |
| 0111 | B | F | 2 |
| 1000 | C | B | FOR REDUNDANCY CHECK |
| 1001 | C | C | " |
| 1010 | C | D | 7 |
| 1011 | C | E | 8 |
| 1100 | D | B | FOR REDUNDANCY CHECK |
| 1101 | D | C | " |
| 1110 | D | D | " |
| 1111 | D | E | 9 |

INPUT SIGNAL

FIG. IIA  AB AC AD AE BB BC BD BE CB CC CD CE DB DC DD DE
         3 4 0 1   5 6 2   7 8   9

FIG. IIB

FIG. IIC

FIG. IID

FIG. IIE

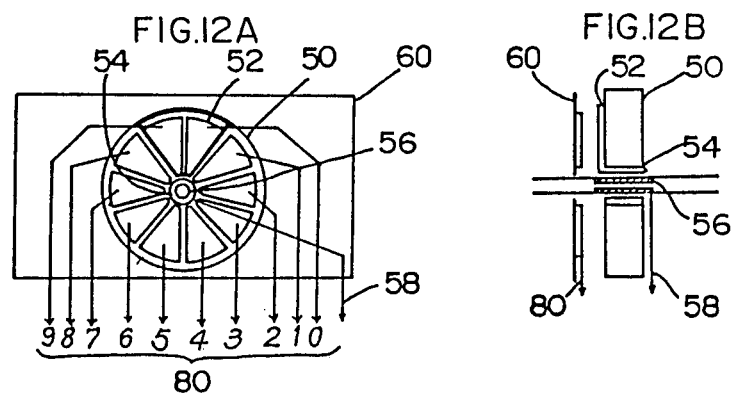
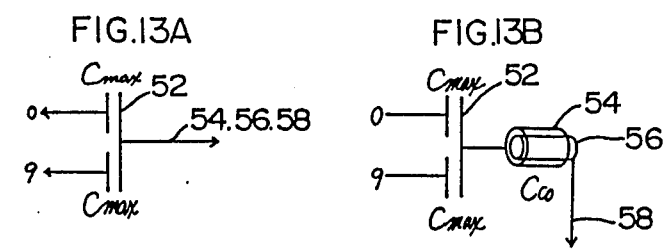

| COUNTER $Q_d\ Q_c\ Q_b\ Q_a$ | ELECTRODE FOR INPUT | | INDICATING NUMBER |
|---|---|---|---|
| 0 0 0 0 | 9 | 0 | 0 |
| 0 0 0 1 | 0 | 1 | 1 |
| 0 0 1 0 | 1 | 2 | 2 |
| 0 0 1 1 | 2 | 3 | 3 |
| 0 1 0 0 | 3 | 4 | 4 |
| 0 1 0 1 | 4 | 5 | 5 |
| 0 1 1 0 | 5 | 6 | 6 |
| 0 1 1 1 | 6 | 7 | 7 |
| 1 0 0 0 | 7 | 8 | 8 |
| 1 0 0 1 | 8 | 9 | 9 |

FIG. 16B

| COUNTER $Q_d\,Q_c\,Q_b\,Q_a$ | ELECTRODE FOR | INPUT | INDICATING NUMBER |
|---|---|---|---|
| 0 0 0 0 | A | B | 3 |
| 0 0 0 1 | A | C | 4 |
| 0 0 1 0 | A | D | 0 |
| 0 0 1 1 | A | E | 1 |
| 0 1 0 0 | B | B | FOR REDUNDANCY CHECK |
| 0 1 0 1 | B | C | 5 |
| 0 1 1 0 | B | D | 6 |
| 0 1 1 1 | B | E | 2 |
| 1 0 0 0 | C | B | FOR REDUNDANCY CHECK |
| 1 0 0 1 | C | C | ″ |
| 1 0 1 0 | C | D | 7 |
| 1 0 1 1 | C | F | 8 |
| 1 1 0 0 | D | B | FOR REDUNDANCY CHECK |
| 1 1 0 1 | D | C | ″ |
| 1 1 1 0 | D | D | ″ |
| 1 1 1 1 | D | E | 9 |

APPARATUS FOR REMOTELY DETERMINING THE ANGULAR ORIENTATION, SPEED AND/OR DIRECTION OF ROTARY OBJECTS

BACKGROUND OF THE INVENTION

The present invention relates generally to a remotely reading means for determining the angular orientation, speed and/or direction of rotary objects such as shaft, dial or meter hands, counter wheel of cyclometer, and the like. More particularly, this invention is concerned with electrically obtaining a signal that is indicative of the angular orientation, speed and/or direction of rotary objects to be monitored without altering the accuracy and operation of the conventional utility meters or the like.

In electric utility system, for instance, sufficient power-generating equipment must be provided at all time to supply power during relatively short period of maximum consumption, however much of this equipment otherwise remains idle for major portion of each day. In order to discourage high power consumption during maximum-demand periods by graduated billing rates, or even to disconnect non-essential portions of customer's load when the customer exceeds a previously agreed consumption rate compatible with the optimum generation capacity of the utility company, rapid determination of an individual customer's consumption rate, commonly termed "demand" over a prescribed time interval is necessary.

Heretofore, such demand metering has generally been possible only through the use of specially equipped meters, commonly limited to a fixed time interval and not capable of transmitting information upon demand to a load-monitoring station in time for the station to take corrective action. There has been considerable effort expended in providing means and apparatus for reading meters at a distance, for example, through telephone lines and the like.

There may be four categories in remote meter reading means: photoelectric cell; sliding mechanical contact; magnetic field; and electric field.

The photoelectric cells have been used in meter reading devices, so that no mechanical connection is needed between the meter and the meter reader. However, these reading devices have been unsatisfactory because a reliable source of light must be provided and the face of the photoelectric cell must be kept sufficiently clean so that the light impinging on the photoelectric cell will not be diminished sufficiently to give a false reading.

The sliding mechanical contact sensor has been used in Neptune's remote meter reading systems granted the U.S. Pat. No. 3,614,774. The use of such sensor is prevented in explosive atmospheres, and in certain instants, changes in the output signal have been noted due to the aging of the components which can change its mechanical and/or electrical characteristics. This type of sensor can not be used for meters which must have high sensitivity such as Watthour meters, because its high pressure on contact.

Magnetically induced reading system was invented by Cain who obtained the U.S. Pat. No. 3,500,365. on it. Cain invented an improved electrically induced reading system by using an electrical transducer unit instead of the magnetic coupling and obtained the U.S. Pat. No. 4,007,454 and U.S. Pat. No. 4,429,308 on it. This sensor has high resolution because the phase of the output signal of the sensor is detected to determine the angular orientation, speed and/or direction of rotary objects. In order to easily detect the phase of the output signal, high frequency input signal has to be used, and therefore, the circuit accompanying the sensor becomes complicated and expensive.

Capacitively sensing device for remotely determining the angular orientation, speed and/or direction of rotary objects was invented by the inventors of this invention and was filed at the Office of Patents Administration of Korea on Apr. 15, 1985. The output signal of the capacitive sensor is in proportion to the capacitance between a stationary electrode and a rotary electrode. The rotary electrode has a physical coupling means to electronic circuit which can be provided at a low price.

However, the capacitively sensing device also has the limitation in the application to the rotary objects with very high speed or small size.

There is thus a need to provide an improved apparatus for determining the angular orientation, speed and/or direction of rotary objects without physically connecting the rotary objects to the measuring device.

Moreover, there is a need to provide an apparatus having an improved characteristics so as to apply it to a rotary objects with small size.

It is accordingly an object of the present invention to provide the capacitively sensing device having improved characteristics and the capacitively reading apparatus which consists of said capacitively sensing device and circuit being manufactured at a very low price, for automatically reading the indication of counter wheel or of pointer of the conventional utility meters such as Water meters. Gas meters, and the like, without affecting the accuracy and operation of the conventional utility meters.

It is another object of the invention to provide a capacitively reading apparatus with improved resolution so as to remotely read the angular position of a rotary objects with small size.

With the apparatus being described herein, any utility meters which are mechanical register type or pointer type can be read by the load-monitoring station with extreme speed permitting the reading of many meters during a short time period, as well as taking several sample readings from each meter to increase the statistical validity of the readings. Thus the utility company can determine not only the total energy consumed by any individual customer during a normal billing period, but also can monitor his demand rate during any desired time interval.

SUMMARY OF THE PRESENT INVENTION

Those objects, as well as further objects which will become apparent in the discussion that follows, are achieved, according to the present invention, by providing a rotary electrode lying substantially on a surface of a rotary object to be monitored and a plurality of stationary electrodes, to be described below, so as to vary the capacitance according to the angular position of the rotary objects by being in confronting relationship to said stationary electrodes.

There may be defined as many discrete capacitors between said stationary electrodes and said rotary electrode as a number N of said stationary electrodes. However, the capacitors of the stationary electrodes which are in confronting relationship to said rotary electrode have a maximum capacitance. Therefore, the angular position of said rotary electrode can be determined by finding the stationary electrodes having said maximum capacitance.

Because M among said N stationary electrodes constitute the capacitors having maximum capacitance by being in confronting relationship to one rotary electrode, the capacitors having the maximum capacitance can be considered and measured as one equivalent capacitor connected either in series or in parallel. According to the connecting methods, either in series or in parallel, many sensing devices having different advantages are obtained.

In any case, the angular position of said rotary electrode is identified by the number of the stationary electrodes having said maximum capacitance.

In accordance with one aspect of the invention, there is provided a capacitively sensing device for monitoring said rotary electrode by connecting only said N stationary electrodes to electronic circuit accompanying said sensing device without phycial contact with said rotary object to be monitored.

In accordance with another aspect of the invention, there is provided a capacitively sensing device using wires much less than a number of said stationary electrodes for connecting said stationary electrodes to said electronic circuit by interconnecting said stationary electrodes themselves in a particular mode.

In accordance with another aspect of the invention, there is provided a capacitively sensing device having the effectively increased maximum capacitance, which is larger than that defined between each of said stationary electrodes and said rotary electrode, by means for electrically connecting said rotary electrode to said electronic circuit.

In accordance with another aspect of the invention, there is provided means for generating a code indicating the angular position of said rotary electrode by scanning said stationary electrodes for input and/or output signals and by measuring the maximum output signal owing to said maximum capacitance of the capacitors existing between said stationary electrodes and said rotary electrode.

In accordance with another aspect of the invention, there is provided means for converting said code into a modulated signal to be transmitted to a distance through 2-wire transmission line.

In accordance with another aspect of the invention, there is provided means for improving the resolution of said capacitively reading apparaus by using A/D converter to detect the output signal of said capacitively sensing device in oder for said capacitively sensing device to be adapted to remotely read the angular position of rotary objects such as pointer-type indicatior as well as the indicating number of counter wheel.

Still other objects and features of the present invention will become more readily apparent to those skilled in the art from the following descriptions when read in conjunction with the accompanying drawings, wherein there are shown and described the preferred embodiments of the invention simply by way of illustration of one of the best modes contemplated for carrying out the invention. As will be realized, the invention is capable of other, different, embodiments and its several details are capable of modifications in various obvious aspects, all without departing from the invention. Accordingly, the drawings and descriptions will be regarded as illustrative in nature and not as restrictive.

BRIEF DESCRIPTION OF THE DRAWINGS

FIGS. 3A–3J are sets of stationary electrodes in confronting relationship to said rotary electrode according to the angular position of rotary objects, which are obtained from the sensing device of FIG. 2F;

FIGS. 4C–4E are the modified apparatus accompanying said sensing device of FIG. 2F;

FIGS. 5A–5H are the typical waveforms being observed at various points of the circuit of FIG. 4;

FIG. 7 is another modified apparatus accompanying said sensing device described in FIG. 2F, from which the high resolution is obtained;

FIG. 8 is a plan view of an alternative embodiment of the sensing device according to the present invention;

FIG. 9 is a modified apparatus accompanying said sensing device of FIG. 8;

FIG. 10 is the corresponding relationship between the code generated from scanning counter, each set of two stationary electrodes to be in confronting relationship to said rotary electrode, and each indicating number of counter wheel being obtained from said apparatus of FIG. 9;

FIG. 11A–11E are the typical waveforms being observed from the circuit of FIG. 9 when the indicating number is 4 and is changing from 6 to 7, respectively;

FIG. 12A and 12B are the plan view and the side view of another preferred feature of the invention, respectively;

FIG. 13A and 13B are the electrically equivalent capacitor model for the sensing device of FIG. 12A;

FIG. 16B is the corresponding relationship between the code generated from the apparatus of FIG. 16A, each set of two stationary electrodes being in confronting relationship to said rotary electrode, and each indicating number of counter wheel to be monitored.

DETAILED DESCRIPTION

Typical prior art sensing devices of the angular orientation, speed and/or direction of a rotary objects are illustrated by the configurations of FIGS. 1A–1D. The sensing device of FIG. 1A consists of the combination of several light sources, phototransistors and a rotary encoder. The angular orientation, speed and/or direction of a shaft is the same as those of the rotary encoder because the rotary encoder is fixed on the shaft to be monitored. Therefore, the angular position of the shaft is determined from the output signal of the phototransistors. This is a very simple and most effective sensing devices because of its very high resolution. Its resolution is about 1.4 degree when the rotary encoder has 8 slots in a radial line. However, this device is applied to the limited area such as motor controller where there is enough room to install the sensing device.

Figure 1A:
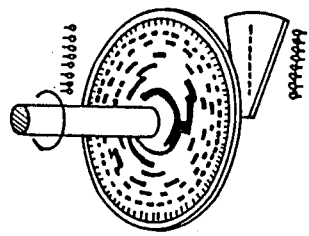
FIGS. 1A–1E are schematic diagrams showing a prior art sensing devices useful in measuring the angular orientation, speed and/or direction of rotary objects.
Figure 1B:
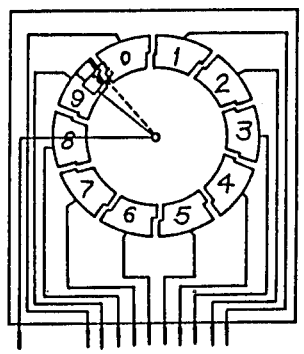

FIG. 1B is another prior art sensing device using mechanically sliding contact. This sensing device consists of 10 stationary electrodes arranged in a circular array and a rotary electrode which is fixed on the rotary objects to be monitored and is sliding on the stationary electrode array. This sensing device has normally one contact between a rotary electrode and one of 10 stationary electrodes corresponding to each of 10 discrete angular positions of the rotary objects. The angular position of the rotary objects is very easily determined by the contact because the contact is mechanically made. In order to improve the resolution of this sensing device, the rotary electrode is made having a very narrow width. This narrow width of the rotary electrode may make the contact disconnected from any stationary electrodes when the rotary electrode is located in the gap between two stationary electrodes.

In order to avoid this situation, two adjacent stationary electrodes have the interleaved parts at both ends as shown in FIG. 1B. These interleaved parts of two adjacent stationary electrodes make two contacts together with one rotary electrode. A special code to distinguish the exact angular position of said rotary electrode from those two mechanical contacts was invented by Neptune company, granted the U.S. Pat. No. 3,614,774. But the mechanically sliding contact is not suitable for remotely reading the sensitive meters such as Watthour meters because of the high pressure on its contact.

Figure 1C:
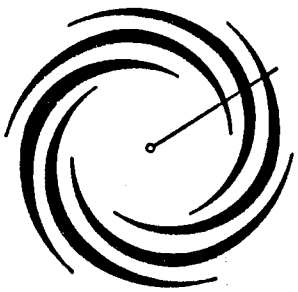

FIG. 1C shows another excellent prior art sensing device to determined the angular orientation, speed and/or direction of rotary objects by electric and/or magnetic fields, granted the U.S. Pat. No. 4,429,308.

Owing to the particularity of crescent-shaped electrodes the area of the stationary electrodes which is underlying and facing the rotary electrode is proportional to the sines of $A\theta$. A is an arbitrary constant and $\theta$ is an angle defined as the angular distance between the rotary electrode's position and the azimuthal angle at which the rotary electrode first encounters the stationary electrode during the hypothetical rotation. Because the area is in proportion to the sines of $A\theta$, the capacitance between stationary electrode and rotary electrode is also in proportion to the sines of $A\theta$. As a result, what to be measured in order to determine $\theta$, the angular position of rotary electrode, is the relative phase of the output signal which is a function of the capacitance.

The electronic circuit for detecting the phase of a signal is usually complicated and expensive. Therefore, this sensing device is not yet put on a commercial basis because of its high price.

Figure 1D:
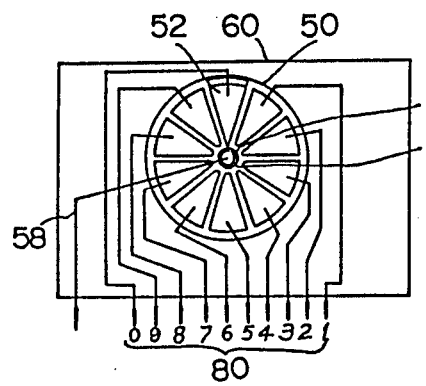
Figure 1E:
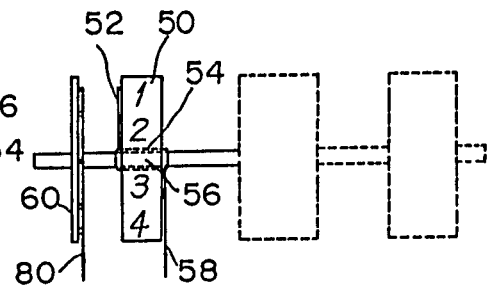

FIG. 1D and 1E shows a plan and side view, respectively of another prior art sensing device invented by the inventors of the present invention and was filed at the Office of Patents Administration of Korea on Apr. 15, 1985. This sensing device also consists of an array of many stationary electrodes and a rotary electrode which is in confronting relationship to only one of the stationary electrodes according to the discrete angular position of the rotary electrode. When the angular distance $\theta$ is defined as the same way as in the sensing device of FIG. 1C, the capacitance between stationary electrode and rotary electrode is directly in proportion to $\theta$ instead of the sines of $A\theta$. Thus, the output signal of the sensing device of FIG. 1D is also directly in proportion to $\theta$ and the electronic circuit accompanying this sensing device can be provided at a low price. Even though the sensing device of FIG. 1D has several advantages over the other sensing devices, it also has a shortcoming in a certain application such as reading the indication of rotary objects whose speed is very high, or whose size is small.

In order to overcome this deficiency in the prior art, there is thus provided the improved capacitively sensing devices and an apparatus accompanying said sensing devices so as to remotely determine the angular position, speed and/or direction of rotary objects.

In accordance with principles illustrative of the present invention, FIGS. 2A–2I describe the exemplary arrangement of rotary and stationary electrodes in order to obtain a capacitively sensing device. The exemplary embodiment of said sensing device explains how to read the indicating number of utility meter at a distance according to the invention, without affecting the accuracy and operation of the conventional utility meter, and which part of the conventional utility meter and how much to be modified for adopting the present invention.

Figure 2A:
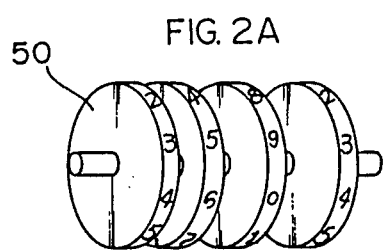
FIG. 2A is a mechanical register set which consists of several counter wheels for a cyclometer.
Figure 2B:
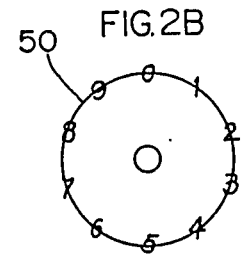
FIG. 2B is a plan view of a counter wheel observed from the left of FIG. 2A.

FIG. 2A shows a register set of counter wheel which is assumed to be a rotary objects to be monitored. FIG. 2B is a plan view of a counter wheel 50 observed from the left of FIG. 2A. Counter wheel 50 has generally 10 discrete angular positions and the number 0 to 9 are designated on its cylindrical surface according to each of its 10 angular positions.

Counter wheel 50 rotates in the direction that shows each number in ascending order when read from the reference point at 12 o'clock.

Figure 2C:
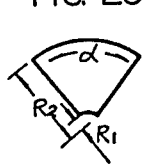
FIG. 2C is a geometrical description of an electrode to be used for this exemplary embodiment.
Figure 2D:
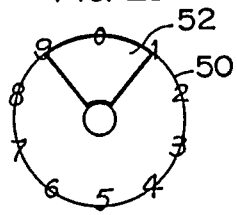
FIG. 2D is the same figure of FIG. 2B except that a rotary electrode described in FIG. 2C is arranged on a cross-sectional surface of counter wheel, whose central angle is selected to be 72 degrees.

FIG. 2D shows the exemplary arrangement of a rotary electrode, in which a fan-shaped rotary electrode 52 whose geometrical description is shown in FIG. 2C is arranged on the cross-sectional surface of counter wheel 50. The rotary electrode 52 is to be monitored to identify the angular position of rotary objects, the indicating number of counter wheel 50. The central angle of rotary electrode 52 is selected to be 72 degrees for a clear illustration.

A rotary electrode 52 is arranged on the cross-sectional surface of a rotary objects to be monitored for the example of FIG. 2D, but can be arranged on any surface such as the cylindrical surface of counter wheel in an appropriate shape to the surface.

Thus, rotary electrode has been prepared on a surface of rotary objects to be monitored for the exemplary embodiment of the invention.

Figure 2E:
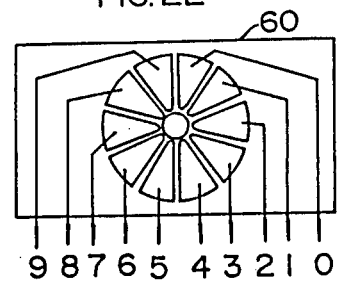
FIG. 2E is a circular array of 10 stationary electrodes whose inner and outer radii are the same as those of the rotary electrodes, respectively, and the central angle of the cone is less than that of the rotary electrode.

Many fan-shaped stationary electrodes are arranged on a stationary plane member in a circular array, because said rotary electrode 52 lying substantially on the cross-sectional surface of counter wheel 50 is a fan-shaped plate. FIG. 2E shows a plan view of a 10 fan-shaped stationary electrodes arranged in a circular array on a stationary plane member 60. The number of said stationary electrodes is selected to be 10 in order to easily understand the principle of the invention by matching the number assigned to each stationary electrode to the number assigned to each angular position of rotary objects to be monitored. Therefore, the area of rotary electrode 52 is twice that of a stationary electrode. In other words, two adjacent stationary electrodes are in confronting relationship to said rotary electrode 52 for the exemplary embodiment of FIG. 2D.

Thus, an array of N equally spaced identical stationary electrodes has been prepared on a stationary plane member for the exemplary embodiment of the invention.

A capacitively sensing device is provided by positioning the stationary member 60 so as to be in confronting relationship to and in parallel to the circumferential path defined by said rotary electrode 52 to be monitored.

Figure 2F:
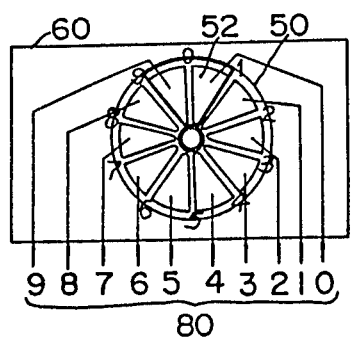
FIG. 2F is a plan view of a preferred embodiment of the sensing device according to the present invention.
Figure 2G:
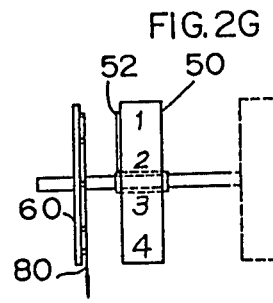
FIG. 2G is a side view of the sensing device shown in FIG. 2F.

FIG. 2F shows the plan view of the capacitively sensing device, which is the exemplary embodiment to explain the principle of the invention. FIG. 2G is the side view of the sensing device of FIG. 2F. The numbers assigned on the cylindrical surface of counter wheel 50 are designated on the outer circle of FIG. 2G. Each number designated inside the circle is corresponding to each of 10 stationary electrodes.

Then, the advanced number of the two numbers assigned to the two stationary electrodes being in confronting relationship to rotary electrode 52 is equal to the indicating number of counter wheel 50. Wires 80 is used for connecting said sensing device to electronic circuit accompanying said sensing device.

In the sensing device of FIG. 2F, 10 discrete capacitors can be defined between 10 stationary electrodes and one rotary electrode. However, 2 of 10 capacitors have a maximum, capacitance, because two stationary electrodes are in confronting relationship to said rotary electrode. The capacitance of other capacitors can be ignored. Then, said sensing device with 10 stationary electrodes can be represented by two capacitors in the viewpoint of electronic circuit elements according to the angular position of said rotary electrode.

Figure 2H:
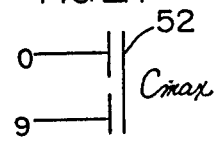
FIG. 2H is an electric capacitor model of FIG. 2F.

FIG. 2H shows the capacitor model for the case of FIG. 2G according to the above description, where two capacitors are connected in series by said rotary electrode. Each of two stationary electrodes whose numbers are 9 and 0, respectively, constructs a capacitor, having the capacitance designated by Cmax, by being in confronting relationship to rotary electrode 52.

The maximum capacitance Cmax is defined as following:

$$Cmax = \frac{\epsilon S}{d}$$

, where S is the area of a stationary electrode, d is the distance between the stationary member 60 and the rotary electrode 52, and $\epsilon$ is the permittivity of the dielectric between said stationary electrode and said rotary electrode.

Figure 2I:
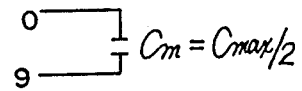
FIG. 2I is a simplified circuit model of FIG. 2H.

Because rotary electrode 52 is considered as a common lead for the two capacitors, as shown in FIG. 2H, FIG. 2H is represented by one equivalent capacitor, having the capacitance designated by Cm, as shown in FIG. 2I.

FIG. 2I shows that 2 of 10 stationary electrodes, the number 9 stationary electrode and the number 0 stationary electrode, are coupled to each other by the maximum capacitance Cm, and other stationary electrodes may be considered as open circuit elements. Thus, two stationary electrodes are coupled to each other by the maximum capacitance Cm only when both two stationary electrodes are in confronting relationship to said rotary electrode. Therefore, the angular position of said rotary electrode can be uniquely identified by finding two stationary electrodes having the maximum capacitance, Cm. The high number of the two stationary electrodes which are coupled to each other by said rotary electrode is equal to the indicating number of counter wheel 50.

The maximum capacitance Cm between a couple of stationary electrodes which will be used for determining the angular position of said rotary electrode is defined as following;

$$Cm = Cmax/2.$$

FIGS. 3A–3J show each set of two stationary electrodes which are capacitively coupled to each other by the maximum capacitance Cm, because the two stationary electrodes are in confronting relationship to rotary electrode 52. Each indicating number of counter wheel 50 is identified from the high number of each set shown in FIGS. 3A–3J, which is the number underlined.

Thus, there is provided a capacitively sensing device providing the corresponding relationship between the number assigned to each stationary electrode and the indicating number of counter wheel to be monitored by said maximum capacitance Cm defined between two adjacent stationary electrodes.

Figures 4A, 4B:
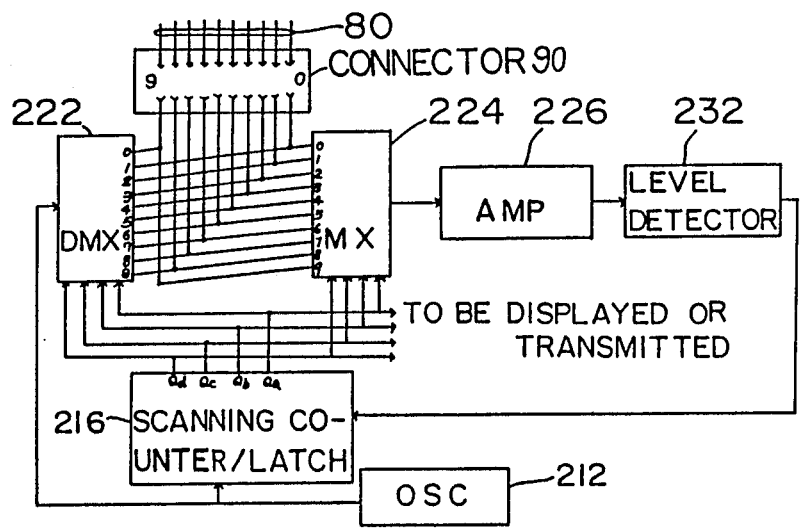
FIG. 4A is a functional block diagram of the apparatus accompanying said sensing device described in FIG. 2F.
FIG. 4B is the corresponding relationship between the code generated from scanning counter, each set of two stationary electrodes to be in confronting relationship to said rotary electrode, and the indicating number of counter wheel being obtained from the apparatus of FIG. 4A.

FIG. 4A is the functional diagram of an apparatus which can generate a binary code corresponding to the indicating number of counter wheel by deterimining the set of said stationary electrodes having said maximum capacitance Cm.

The reading apparatus comprises oscillator 212, scanning counter and latch 216, analog demultiplexer 222, sensing device, analog multiplexer 224 and amplifier 226. Wires 80 of said sensing device is connected to analog demultiplexer 222 and analog multiplexer 224 by connector 90. Scanning counter and latch 216, analog demultiplexer 222 and analog multiplexer 224 constitute a scanning device which is scanning each stationary electrode or input and/or output signals. Scanning counter and latch 216 is also used to count the clock pulse and store its own number by latch pulse.

They are connected in such a manner that, while input signal is sequentially applied to each of 10 stationary electrodes, an output singal is measured at the stationary electrode whose number is higher, by one, than that of the stationary electrode for the input signal.

The signal obtained from oscillator 212 is applied to one of 10 stationary electrodes of said sensing device by analog demultiplexer 222 and to counter 216. Analog multiplexer 224 is used to obtain the output signal from the stationary electrode whose number is higher, by one, than that of the stationary electrode to which an input signal is applied analog demultiplexer 222.

The output signal from analog multiplexer 224 is amplified by amplifier 226 so as to have enough magnitude, and then applied to level detector 232. Level detector 232 distinguishes the output signal of amplifier 226 corresponding to the angular position of said rotary electrode 52 from others which can be considered as noises. The output signal from level detector 232 is used as a timing signal to latch the content of counter 216. When the output signal is obtained from level detector 232, the content of counter 216 is the binary code corresponding to the indicating number of counter wheel 50. Therefore, the code to determine the angular position of said rotary electrode is obtained in binary form by latching the content of counter 216 by the output signal obtained from level detector 232. The code can be displayed on or transferred to a local facility for further process.

FIG. 4B is a table which represents the corresponding relationship between said code and the indicating number of counter wheel by set of stationary electrodes being selected for input and output signals, which is obtained from FIG. 4A.

Thus, there is provided an capacitively reading apparatus which can determine the indicating number of counter wheel, that is the angular position of rotary objects, without making mechanical contact with the rotary objects.

Figure 4C:
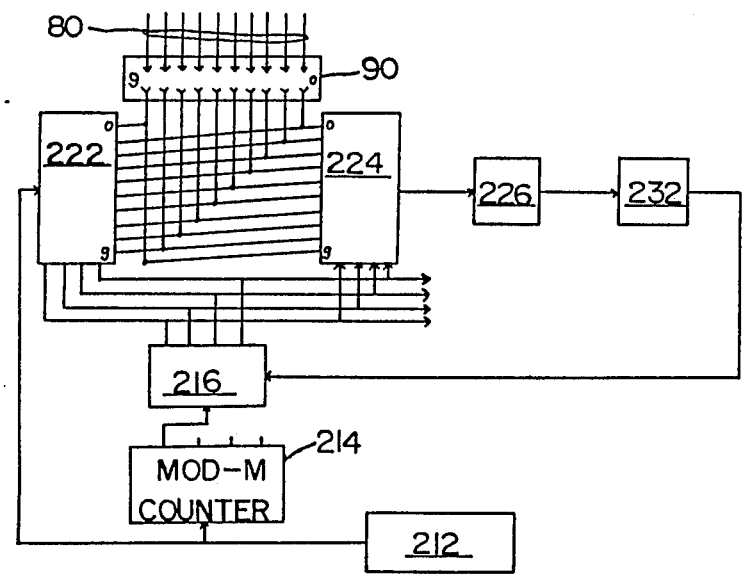

FIG. 4C shows a modified block diagram of said apparatus, in which mod-m counter 214 is used between oscillator 212 and counter 216 in order to apply an input signal consisting of several periods to each stationary electrode of said sensing device. Whenever each pulse is applied to counter 216 from counter 214, counter 216 sequentially selects each channel of analog demultiplexer 222 and analog multiplexer 224. Therefore, the number of periods of the input signal applied to each stationary electrode through analog demultiplexer 222 is m.

Figure 4D:
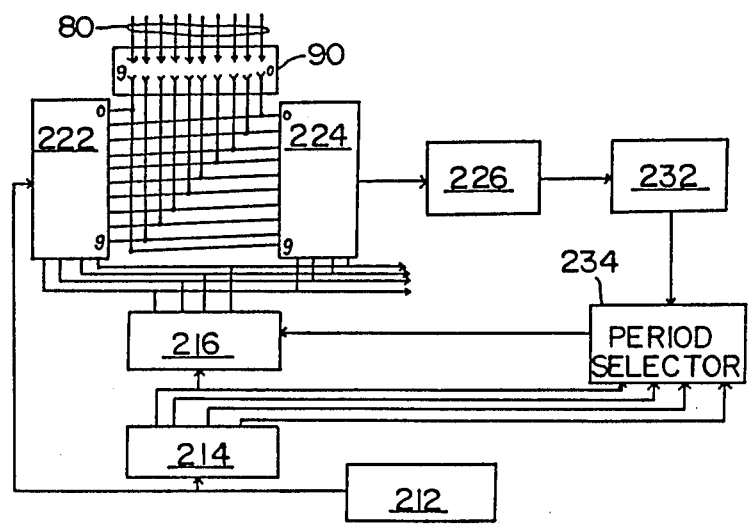

FIG. 4D shows another modified apparatus, in which period selector 234 is used for rejecting the first and last periods of said output signal from level detector 232, because the output signal from level detector 232 during those periods can contain unwanted components introduced by switching operation of analog demultiplexer 222 and analog multiplexer 224. Period selector 234 is to select the central periods of the output signal of level detector 232. Therefore, the reliability of said apparatus is improved by using the output signal from period selector 234 as timing signal for latching the code stored in counter 216.

FIG. 4E is another modified apparatus for generating a carrier signal whose periods are in corresponding relationship to each number assigned to said stationary electrodes, for generating a modulation signal corresponding to the output signal from period selector 234, and for generating a modulated signal to be transmitted to a central facility at a distance through 2-wire transmission line.

The length of one period of the input signal to counter 216 is equal to the time for each stationary electrode to be connected to the input signal through analog demultiplexer 222, that is, the time for each code to be held in counter 216. The input signal waveform to counter 216 is converted into a sinusoidal waveform by filter 242, even though it could be converted after modulated. This sinusoidal waveform from filter 242 is used as a carrier to transmit said code to a central facility at a distance through 2-wire transmission line.

Thus, there is provided means for generating a carrier whose period is corresponding to each angular position of said rotary electrode, that is each of the discrete angular positions of rotary objects, is provided by the invention.

The output of period selector 234 can be used as a modulation signal, but it is first converted into a sinusoidal waveform by filter 244 and then is used as a modulation signal. Said modulation signal is obtained during the period of said carrier which is corresponding to the indicating number of counter wheel.

Both said carrier signal and said modulation signal are simultaneously applied to modulator 246. The period of said carrier which is corresponding to the stationary electrode from which said modulation signal is obtained is modulated with said modulation signal. The modulated signal being obtained from modulator 246 is to be transmitted to a central facility at a distance through 2-wire transmission line.

Thus, a modulated signal transmitting the information of the indicating number of counter wheel, the angular position of rotary objects, is easily generated according to the invention.

When said modulated signal is received at a central facility, the indicating number of counter wheel is recovered from the number of the period of said carrier modulated with said modulation signal.

As an example, the indicating number of counter wheel 50 in FIG. 4E is assumed to be 4. This example shows how to convert the indicating number 4 of counter wheel 50 into the 5th period of carrier and then how to modulate the 5th period of carrier. Because the indicating number of counter wheel 50 is 4, the rotary electrode 52 is in confronting relationship to two stationary electrodes whose numbers are 3 and 4, as shown in FIG. 3E.

Typical waveforms observed at various points of the circuit of FIG. 4E are shown in FIGS. 5A–5H.

FIG. 5A shows the waveform of oscillation signal. FIG. 5B shows the output of counter 214 which is a mod-4 counter. The input of counter 216 is converted into sinusoidal waveform, as shown in FIG. 5C, by filter 242. This sinusoidal waveform is used as the carrier for transmission. The number of the stationary electrode which is the indicating number of counter wheel is designated above the waveform of FIG. 5A.

FIG. 5D shows the output waveform of amplifier 226. The signal during 5th period of said carrier is corresponding to 4 which is the indicating number of counter wheel 50, and the signal during the other periods is due to noise. Because counter 214 is a mod-4 counter, the output from amplifier 226 is the signal of only 4 periods.

FIG. 5E is the output signal from level detector 232, which is the signal for the indicating number of counter wheel 50.

FIG. 5F shows that both the first and the last periods of the output signal obtained from level detector 232 are rejected by period selector 234. The output signal from period selector 234 is converted into a sinusoidal waveform, as shown in FIG. 5G, by bandpass filter 244.

Both the carrier of FIG. 5C and the modulation signal of FIG. 5G are applied to modulator 246. Then the 5th period of said carrier is modulated with said modulation signal, as shown in FIG. 5H. The waveform of FIG. 5H can be transmitted to a central facility through 2-wire transmission line.

Thus, the modulated signal transmitting the indicating number 4 of counter wheel 50 to a distance is generated by the capacitively reading apparatus shown in FIG. 4E.

When this modulated waveform is received at a central facility, the indicating number 4 of counter wheel 50 is easily recovered from the 5th period of the received waveform by hardware/software of a large computer system, because the 5th period of carrier can be easily detected.

However, there may be ambiguous situation in visually reading the indicating number of counter wheel whenever the indicating number of counter wheel of the next low figure is changing from 9 to 0. The same situation can occur to this reading apparatus.

FIGS. 6A–6F show an example of this situation that the indicating number of counter wheel 50a of high figure is changing from 5 to 6 because the indicating number of the counter wheel 50b of the next low figure is changing from 9 to 0.

Figure 6A:
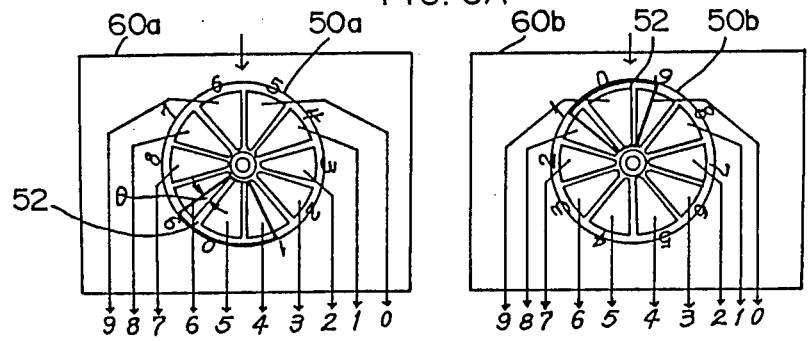
FIG. 6A–6C are the plan view of two counter wheels indicating the number of two figures, in which the indicating number is changing from 59 to 60, and its electrically equivalent capacitor model, respectively.

As shown in FIG. 6A, rotary electrode 52 of counter wheel 50a for high figure is in confronting relationship to three stationary electrodes whose numbers are 4, 5, and 6, respectively.

Figure 6B:
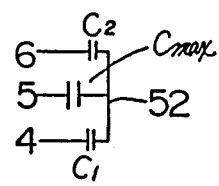

FIG. 6B is an electrical capacitor model for FIG. 6A. C1 is the capacitance between the stationary electrode of number 4 and rotary electrode 52, and C2 is the capacitance between the stationary electrode of number 6 and rotary electrode 52. The capacitance between the stationary electrode of number 5 and rotary electrode 52 has a maximum Cmax. $\theta$ is the angle defined in FIG. 6A. Then, C1 and C2 are defined as followings:

$$C1 = Cmax \times \left[1 - \left(\frac{\theta}{36}\right)\right]$$

$$C2 = Cmax \times \left(\frac{\theta}{36}\right)$$

Figure 6C:
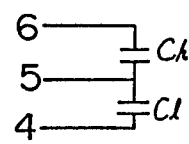

Cl and Ch designated in FIG. 6C are the equivalent capacitances to the capacitor model of FIG. 6B, respectively. Cl is the capacitance between the stationary electrode of number 4 and the stationary electrode of number 5. Ch is the capacitance between the stationary electrode of number 5 and the stationary electrode of number 6. Then, Cl and Ch are defined as followings:

$$Cl = 1/[1/C1 + 1/Cmax]$$
$$= Cmax \times \left[1 - \left(\frac{36}{72 - \theta}\right)\right]$$

$$Ch = 1/[1/C2 + 1/Cmax]$$
$$= Cmax \times \left[1 - \left(\frac{36}{36 + \theta}\right)\right]$$

When $\theta$ becomes ~degrees, then $$Cl = Ch = \frac{Cmax}{3}$$
$$= \frac{2\,Cm}{3}$$

Therefore, the reference level of said level detector 232 is selected to be just below the output level being obtained from amplifier 226 when $\theta$ is 18 degrees. Then, the modulation signal is obtained from bandpass filter 244 for two periods of carrier, the 6th and 7th periods, as shown in FIG. 6E.

Figure 6D:
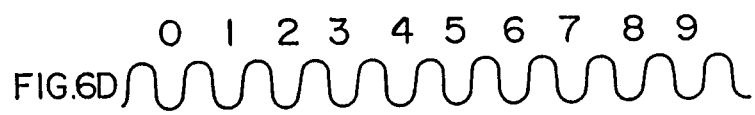
FIG. 6D–6F are the typical waveform being observed from said apparatus of FIG. 4E for the case of FIG. 6A.
Figure 6E:
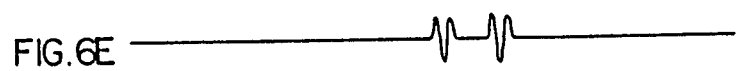
Figure 6F:

FIG. 6D is the carrier, the same as that of FIG. 5C. FIG. 6F is the modulated output waveform obtained from modulator 246 according to the modulation waveform of FIG. 6E.

Thus, when the indicating number of counter wheel is changing from one number to the next number, the carrier is modulated for two periods corresponding to those two indicating numbers, respectively, by the two modulation signals.

However, the correct indicating number of counter wheel can be recovered from the two modulated periods of the carrier when the modulated waveform is received at a central facility. When the waveform of FIG. 6F is received at a central facility, the correct indicating number of counter wheel can be recovered from the modulated periods of the received waveform.

If the indicating number of counter wheel 50b of the low figure has already been determined to be 9 at the central facility, the number for the high figure must be determined to be low number by the first modulated period of the received waveform, to be number 5 by the 6th period for this case.

On the contrary, if the number for the low figure has already been determined to be 0, the number for the high figure must be determined to be the high number, instead of the low number, by the second modulated period of the received waveform, to be number 5 instead of number 6 by the 7th period for this case. The correct decision on the ambiguous situation described above can be made by said apparatus, but the situation is transmitted to a central facility by the modulation method described above. By doing so, the capacitively reading apparatus can be provided at a very low price.

The resolution of the capacitively reading apparatus of FIGS. 4A–4E is primarily dependent upon the number of said stationary electrodes and the resolution of said level detector.

However, the resolution of said capacitively reading apparatus can be improved by using A/D converter in order to detect the level of the output signal obtained from said amplifier.

FIG. 7 shows another modified apparatus using averager 612, A/D converter 614, and microcomputer 616.

Averager 612 converts the output signal from amplifier 226 into DC level signal. The DC level signal from averager 612 is applied to A/D converter 614 so as to be converted into B-bit binary number. There are 10 B-bit binary numbers corresponding to 10 discrete angular position of said rotary electrode 52. A maximum value among 10 B-bit binary numbers can be determined by a comparator device, but it is determined by microcomputer 616 for this embodiment.

Microcomputer 616 reads the output from A/D converter 614 at the center of each period of said carrier. In other words, microcomputer 616 reads 10 output numbers from A/D converter 614 corresponding to each of said stationary electrodes. After that, microcomputer 616 determines the number of stationary electrode corresponding to the indicating number of counter wheel by evaluating a maximum value.

In order to improve the reliability, microcomputer 616 may read the output from A/D converter several times during each period of said carrier, calculate the mean value for each of 10 periods of said carrier, determine a maximum value among 10 mean values, and then determine the content of counter 216 corresponding to said maximum value. Said content of counter 216 is just equal to the indicating number of counter wheel to be monitored. If the maximum value of the output signal from averager 612 is obtained at Cm (Cmax/2) and is adjusted to be equal to the maximum dynamic range for the input of 8-bit A/D converter 614, then the resolution being obtained from the circuit of FIG. 7 is approximately evaluated as following:

$$\text{resolution} = 360/10/2^{**}8$$
$$= 0.14 \text{ degree/bit}$$

This high resolution of the capacitively reading apparatus shown in FIG. 7 will be superior to any other apparatus being manufactured at the same price.

Thus, there is provided a capacitively reading apparatus having a relatively high resolution of the angular position of rotary objects by using A/D converter to measure the output signal obtained from said amplifier.

Microcomputer 616 can be used for generating a FSK or other modulated signal to be transmitted to a distance through 2-wire transmission line, as well as for determining the indicating number of counter wheel from the number of stationary electrode having a maximum output signal.

The microcomputer-based configuration of FIG. 7 can also provide many other advantageous functions such as real time data collection, demand metering, demand limiting, time-of-use metering, peak alert, prepaid metering, standard modem signal generation, etc., by its software.

FIG. 8 shows a plan view of the exemplary connection having another preferred feature of the present invention provided by connecting said N stationary electrodes to each other in particular mode. By doing so, the number of connecting wires from said stationary electrodes to said analog demultiplexer and/or analog multiplexer is greatly reduced and the number of channels of said analog demultiplexer and/or analog multiplexer is also greatly reduced.

In this connection, every other stationary electrode is designated by A, B, C, D, and E, respectively, in the clock-wise direction. Each of these five stationary electrodes is connected to every two other stationary electrode, respectively, in the clock-wise direction, and has a wire to be connected to said electronic circuit. In other words, 5 wires are needed in order for 10 stationary electrodes of said sensing device to be scanned by said electronic circuit accompanying said sensing device.

FIG. 9 shows another modified apparatus accompanying said sensing device shown in FIG. 8. The structure and operation of said apparatus is the same as that of FIG. 4 except the reduced number of channels of analog demultiplexer 222 and of analog multiplexer 224. According to this connecting mode, the number of wires for scanning 10 stationary electrodes is reduced to a half of the number of stationary electrodes. However, the number of channels of analog multiplexer 222 and of analog multiplexer 224 is 4, less than a half of that for the sensing device of FIG. 2F.

This is an excellent merit for developing the circuit as a single chip. FIG. 10 shows the corresponding relationship between the code generated by counter 216 and the indicating number of counter wheel 50, which is obtained from the circuit of FIG. 9. While the sequence of the indicating number of counter wheel is presented in natural order in the sensing device of FIG. 2, the sequence for the sensing device of FIG. 8 is mixed up, as shown in FIG. 10. Therefore, the order of the period of carrier being modulated with the modulation signal does not follow to the natural order. However, as shown in FIG. 10, each number of counter 216 is uniquely corresponding to the set of stationary electrodes which are in confronting relationship to rotary electrode 52, and each set of said stationary electrodes is uniquely corresponding to each indicating number of counter wheel 50. On the other hand, the apparatus of FIG. 9 transforms the input waveform of counter 216 into a sinusoidal carrier whose period is uniquely corresponding to each number of counter 216.

FIGS. 11A–11E are typical output waveforms being obtained from the circuit of FIG. 9 when the indicating number of counter wheel 50 is 4.

FIG. 11A is the waveform showing the corresponding relationship between each period of said carrier and each set of stationary electrodes which are selected for input and output signals during the corresponding period.

In this example, the output signal from amplifier 226 is obtained during the second period of carrier, as shown in FIG. 11B, because the output signal is presented at stationary electrode of B only when an input signal is applied to the stationary electrode of A, as shown in FIG. 10.

When the carrier signal of FIG. 11A and the modulation signal of FIG. 11B are simultaneously applied to modulator 246, the modulated output signal shown in FIG. 11C is obtained so as to be transmitted to a distance through 2-wire transmission line.

In the circuit of FIG. 9, four periods of carrier may be modulated when the angular position of counter wheel 50 is in the transition from one number to the next. In this case, said rotary electrode is in confronting relationship to three stationary electrodes.

FIG. 11D shows the modulation waveform obtained from the circuit of FIG. 9 when the indicating number of counter wheel 50 is changing from 6 to 7. The first two modulation waveforms are obtained whenever an output signal is measured at the stationary electrode of D, and the second two modulation waveforms are obtained when an input is applied to the stationary electrode of B. The carrier of FIG. 11A and the modulation signal of FIG. 11D are applied so as to obtain the modulated waveform, as shown in FIG. 11E, which can be transmitted to a distance through 2-wire transmission line.

However, the modulated signals of FIG. 11C and FIG. 11E, which are obtained from the circuit of FIG. 9, can be used for transmitting the information of the indicating number of counter wheel to a distance through 2-wire transmission line.

The correct indicating number of a counter wheel can be recovered from the modulated waveform shown in FIG. 11C or in FIG. 11E when the waveform is received at a central facility at a distance.

Thus, there is provided the simplified scanning circuit in said apparatus by interconnecting the stationary electrodes each other in a particular mode.

FIGS. 12A and 12B show a plan and side view, respectively of another preferred feature of the invention provided by means for connecting said rotary electrode to the circuit accompanying said sensing device so as to effectively increase said maximum capacitance.

One approach to connect said rotary electrode 52 to said circuit is to make both female 54 and male 56 of the counter wheel 50 conductive material.

In this example, female 54 is fixed to counter wheel 50, as shown in FIG. 12B.

Rotary electrode 52 is in confronting relationship to only two stationary electrodes for this exemplary embodiment, but the rotary electrode 52 may be constructed to be in confronting relationship to M among N stationary electrodes according to a desired sensitivity.

The conductive female 54 is connected to rotary electrode 52 and the conductive male 56 has a wire 58 to be connected to electronic circuit. The conductive female 54 is made so as to frictionlessly rotate on the conductive male 56. Therefore, there exists an electrically complete contact between the rotary electrode 52 and the wire 58 through the female 54 and the male 56. FIG. 13A is the electrically equivalent circuit model of said sensing device for that case, in which said sensing device is represented by two capacitors having said maximum capacitance Cmax defined between wire 58 and the stationary electrodes which are in confronting relationship to rotary electrode 52.

However, as a worst case, a complete contact between the conductive female 54 and the conductive male 56 may not exist. Then, the cnductive female 54 and the conductive male 56 can be considered as a coaxial capacitor, as shown in FIG. 13B.

The capacitance Cco of said coaxial capacitor is defined as following:

$$Cco = \frac{K}{\text{Log}(1/a) - \text{Log}(1/b)}$$

where K is a proportional constant, a is the radius of the conductive male 56 and b is the radius of the female 54.

Because the radius of the female 54 is nearly equal to the radius of the male 56. Cco may be considered as infinity when compared to Cmax. Thus, the electrically equivalent circuit shown in FIG. 13A is also applied to the worst case.

This means that the conductive female 54 always makes an electrically complete connection with the conductive male 56 and the sensing device shown in FIG. 12A can be represented by the equivalent circuit of FIG. 13A.

Two stationary electrodes are in confronting relationship to said rotary electrode for this exemplary embodiment of FIG. 12A. Therefore, in order to connect said two maximum capacitances in parallel, said stationary electrodes have to be scanned in such a manner that two adjacent stationary electrodes are always connected to an input or output terminal.

Then, the input signal of said sensing device can be transmitted to the maximum output of said sensing device through the capacitance 2Cmax. Therefore, the maximum magnitude of the output signal of the sensing device of FIG. 12A is expected to be four times that of FIG. 2F in which an input signal is transmitted to the output of the sensing device through the capacitance Cm(=Cmax/2).

This means that said sensing device shown in FIG. 12A can accompany more simplified apparatus or can be made in much smaller size than the sensing device of FIG. 2 under the same conditions for said electronic circuit.

Thus, means for providing a smaller sensing device is provided by constructing two conductors having an electrically complete contact between them, of which one conductor is connected to said rotary electrode and the other conductor is connected to the electronic circuit accompanying said sensing device.

Figures 14A, 14B:
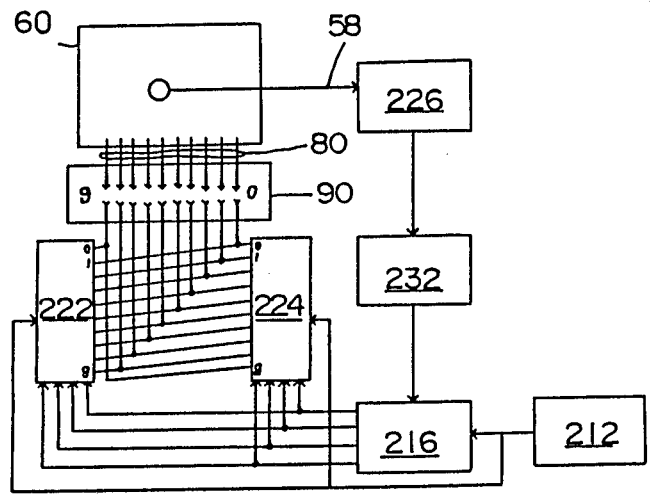
FIGS. 14A is another modified apparatus accompanying said sensing device of FIG. 12A.
FIG. 14B is the corresponding relationship between the code generated from the apparatus of FIG. 14A, each set of two stationary electrodes being in confronting relationship to said rotary electrode, and the indicating number of counter wheel to be monitored.

FIG. 14A shows the apparatus accompanying said sensing device of FIG. 12A. In this embodiment, an input signal is simultaneously applied to two adjacent stationary electrodes by connecting the output terminal of analog multiplexer 224, which is used as the output terminal in FIG. 4A, to the input terminal of analog demultiplexer 222. Output signal is measured from wire 58 connected to said male 56 which is coupled to said rotary electrode 52 through female 54. The operation of said apparatus of FIG. 14A is the same as that of FIG. 4A, except the modified scanning device.

FIG. 14B is the corresponding relationship between said code generated by said apparatus and the indicating number of counter wheel to be monitored by said maximum capacitance 2Cmax. This is the same as that of FIG. 4B.

Figure 15:
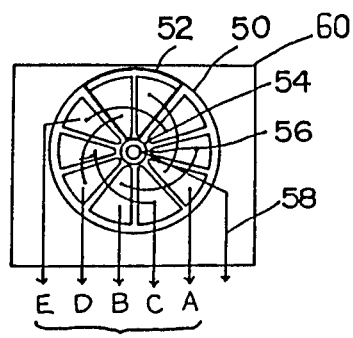
FIGS. 15A and 15B are another preferred embodiment of said sensing device of FIG. 12A.
Figure 15:
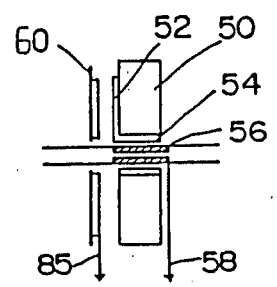

FIGS. 15A and 15B show a plan and side view, respectively, of another preferred feature of the invention by connecting said stationary electrodes of said sensing device shown in FIG. 12A to each other in a particular mode. Said connecting mode is the same as that of FIG. 8.

Figure 16A:
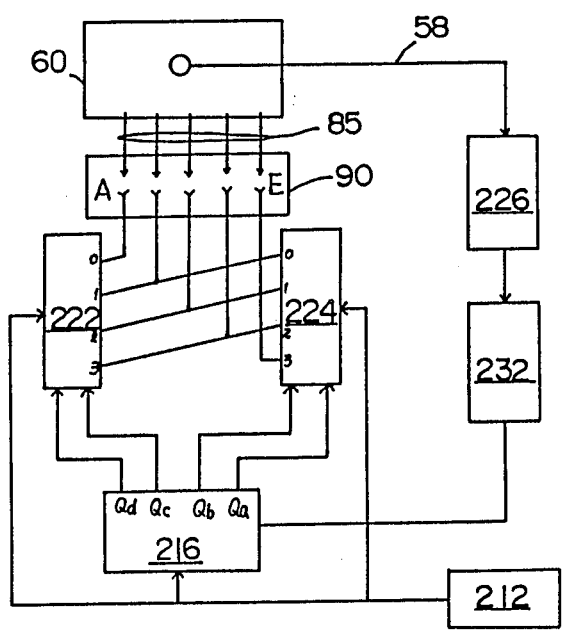
FIGS. 16A is another modified apparatus accompanying said sensing device of FIG. 15.

FIG. 16A is another modified apparatus accompanying said sensing device. In order to simultaneously apply an input signal to each set of two stationary electrodes in confronting relationship to said rotary electrode, the output terminal of analog multiplexer 224 is connected to the input terminal analog demultiplexer 222. The output signal is measured from wire 58 of said sensing device.

FIG. 16B shows the corresponding relationship between each set of two stationary electrodes and each indicating number of counter wheel to be monitored, which is the same as that of FIG. 10. Therefore, the operation of said apparatus of FIG. 16A is also the same as that of FIG. 9.

In the apparatuses described above, an input signal is applied to the stationary electrodes and an output signal is measured from wire 58 connected to said male conductor. However, the input signal can be applied to wire 58 and the output signal can be measured by scanning said stationary electrodes. Its operation is also described in the same way as the above.

In order for all the circuit presented in this documentation to be used for remotely reading the number of multiple figures of utility meter, another analog demultiplexer for input signal and/or another analog multiplexer for output signal may be used in the code generator.

The reading apparatuses according to the present invention do not need a DC power supply except only when there is a need to read the indication of meters, because said apparatuses can be used together with conventional utility meters by keeping the mechanical indicating structure of the meters. Moreover, the DC power can be supplied from a central facility to said apparatuses through 2-wire transmission line. Therefore, said apparatuses are connected to the 2-wire transmission line through power-line interface circuit. Power-line interface circuit may consist of resonant circuit and on/off switch. When there is a need to read an utility meter with this apparatus, an interogation signal together with DC power is sent from a central facility to the meter through 2-wire transmission line. The interogation signal is detected by the filtering operation of power line interface circuit and causes a magnetic relay or electronic switch to be turned on in order for the DC power to be supplied to the meter.

The transmission line is used to collect the meter readings as well as to supply the interogation signal and DC power to the meter to be monitored.

While there have been described what are believed to be the preferred embodiments of the present invention, those skilled in the art will recognize that various changes and modifications may be made thereto without departing from the principles of the invention, and it is intended to claim all such embodiments as fall within the true scope thereof.

What is claimed is:

1. A capacitively reading apparatus for remotely reading the angular position, speed and/or direction of rotation of a rotary member as it rotates about an axis of rotation and defines a circumferential path comprising:
   a. means for arranging a rotary electrode on a surface of said rotary member to be monitored;
   b. means for arranging an array of stationary electrodes on a surface of a stationary member whose surface is positioned in a confronting relationship to said circumferential path so that capacitance is defined between each of said stationary electrodes and said rotary electrode, a plurality of said stationary electrodes being in a confronting relationship to said rotary electrode according to the angular position of said rotary electrode, have dominant capacitance;
   c. means for being connected to said electrodes to apply an input signal to said capacitance and measure an output signal which is in position to said capacitance;
   d. means for generating codes, each of which is corresponding to each angular position of said rotary member, while applying said input signal to said capacitance and measuring the output signal owing to said capacitance;
   e. means for latching the codes corresponding to the angular position of said rotary electrode by a maximum output signal owing to said dominant capacitance; and
   f. means for transmitting said codes to one of a local facility for display and a central facility at a distance for further process, wherein said applying means includes means for insuring said output signal obtained during one of said codes consists of several periods, further comprising means for selecting the central periods of said output signal.

2. A capacitively reading apparatus for remotely reading the angular position, speed and/or direction of rotation of a rotary member as it rotates about an axis of rotation and defines a circumferential path comprising:
   a. means for arranging a rotary electrode on a surface of said rotary member to be monitored;
   b. means for arranging an array of stationary electrodes on a surface of a stationary member whose surface is positioned in a confronting relationship to said circumferential path so that capacitance is defined between each of said stationary electrodes and said rotary electrode, and a plurality of said stationary electrodes, being in a confronting relationship to said rotary electrode according to the angular position of said rotary electrode, have dominant capacitance;
   c. means for being connected to said electrodes to apply an input signal to said capacitance and measure an output signal which is in position to said capacitance;
   d. means for generating codes, each of which is corresponding to each angular position to said rotary member, while applying said input signal to said capacitance and measuring the output signal owing to said capacitance;
   e. means for latching the codes corresponding to the angular position of said rotary electrode by a maximum output signal owing to said dominant capacitance; and
   f. means for transmitting said codes to one of a local facility for display and a central facility at a distant for further process, wherein said transmitting means is achieved by modulating a carrier, which is the input waveform of a counter which is used to scan said stationary electrodes, with a modulation signal which is said maximum output signal.

3. An apparatus according to claim 2, wherein said carrier is converted into a sinusoidal waveform by a filtering function and said modulation signal is converted into a sinusoidal waveform by filtering function.

4. An apparatus according to claim 2, wherein said sinusoidal waveforms are obtained by integrating functions.

5. A capacitively sensing device for remotely monitoring the angular position, speed and/or direction of rotation of a rotary member as it rotates about an axis of rotation and defines a circumferential path comprising:
   an array of N identical stationary electrodes substantially arranged on equally divided N areas on a surface of a stationary member which is positioned in parallel to said circumferential path where N is an integer;
   a rotary electrode substantially arranged on a surface of the rotary member in such a manner that said rotary electrode is unsymmetrical about an axis of rotation and is in confronting relationship to M stationary electrodes among said N stationary electrodes, where M is an integer greater than one and less than N;
   means for applying one analog input signal simultaneously to M capacitors defined between said M stationary electrodes and said rotary electrode, where each capacitor has a maximum capacitance defined by the area of a stationary electrode; and
   means for measuring an output signal whose magnitude is in proportion to said maximum capacitance;

wherein said applying means comprises means for connecting said input signal simultaneously to K stationary electrodes among said M stationary electrodes where K is an integer less than M; and said measuring means comprises means for connecting an amplifier simultaneously to the remaining M-K stationary electrodes among said M stationary electrodes in such a manner that said amplifier provides a maximum analog output signal which is responsive to the sum of capacitively induced signals in said M-K stationary electrodes.

6. A sensing device according to claim 5, wherein N is 10;

M is 2;

said input signal is connected to one of said 2 stationary electrodes which are in confronting relationship to said rotary electrode; and said amplifier is connected to the other of said 2 stationary electrodes.

7. A sensing device according to claim 6, wherein each of alternate 5 stationary electrodes (A, B, C, D, E) among said 10 stationary electrodes is connected to the third stationary electrode from that stationary electrode, respectively, in the same direction;

said rotary electrode is in confronting relationship to 2 stationary electrodes which are next to each other;

said input signal is connected to one of said 2 stationary electrodes through one of said 5 stationary electrodes (A, B, C, D, E); and said amplifier is connected to the other stationary electrode of said 2 stationary electrodes through one of the remaining 4 stationary electrodes except the one connected to said input signal among said 5 stationary electrodes (A, B, C, D, E).

8. A capacitively reading apparatus for remotely monitoring the angular position, speed and/or direction of rotation of a rotary member as it rotates abut an axis of rotation and defines a circumferential path comprising:

an array of N identical stationary electrodes substantially arranged on equally divided N areas on a surface of a stationary member which is positioned in parallel to said circumferential path, where N is an integer;

a rotary electrode substantially arranged on a surface of the rotary member in such a manner that said rotary electrode is unsymmetrical about an axis of rotation and is in confronting relationship to M stationary electrodes among said N stationary electrodes, where M is an integer less than N;

means for applying an analog input signal of P cycles simultaneously to K stationary electrodes among said M stationary electrodes, where P and K are integers and K is less than M;

means for connecting an analog amplifier simultaneously to the remaining M-K stationary electrodes among said M stationary electrodes so as to provide a maximum analog output signal which is responsive to the sum of capacitively induced signal in said M-K stationary electrodes;

means for converting the analog output signal obtained from said amplifier into a digital signal;

means for counting the number of one among said M stationary electrodes which are connected between said input signal and said output signal; and means for latching said number by said digital signal.

9. An apparatus according to claim 8, wherein N is 10;

M is 2;

said means for applying said analog input signal comprises a means for connecting one of said 2 stationary electrodes, which are in confronting relationship to said rotary electrode, to said input signal; and said means for connecting to said amplifier comprises a means for connecting the other stationary electrode of said 2 stationary electrodes to said amplifier.

10. An apparatus according to claim 9, wherein each of alternate 5 stationary electrodes (A, B, C, D, E) among said 10 stationary electrodes is connected to the third stationary electrode from that stationary electrode, respectively, in the same direction;

said rotary electrode is in confronting relationship to 2 stationary electrodes which are next to each other;

said means for applying an input signal comprises a means for connecting one of said 2 stationary electrodes which are in confronting relationship to said rotary electrode to said input signal through one of said 5 stationary electrodes (A, B, C, D, E); and said means for connecting said amplifier comprises a means for connecting the other stationary electrode of said 2 stationary electrodes to said amplifier through one of the remaining 4 stationary electrodes except the one connected to said input signal among said 5 stationary electrodes (A, B, C, D, E).

11. A capacitively reading apparatus for remotely monitoring the angular position, speed and/or direction of rotation of a rotary member as it rotates about an axis of rotation and defines a circumferential path comprising:

an array of N identical stationary electrodes substantially arranged on equally divided N areas on a surface of a stationary member which is positioned in parallel to said circumferential path where N is an integer;

a rotary electrode substantially arranged on a surface of the rotary member in such a manner that said rotary electrode is unsymmetrical about an axis of rotation and is in confronting relationship to M stationary electrodes among said N stationary electrodes where M is an integer less than N;

means for applying an analog input signal of P cycles simultaneously to K stationary electrodes among said M stationary electrodes where P and K are integers and K is less than M;

means for connecting an analog amplifier simultaneously to the remaining M-K stationary electrodes among said M stationary electrodes so as to provide a maximum analog output signal which is responsive to the sum of capacitively induced signal in said M-K stationary electrodes;

means for converting said analog output signal into a digital signal;

means for generating a carrier signal from said input signal;

means for generating a modulation signal from said digital signal; and means for modulating said carrier signal with said modulation signal.

12. An apparatus according to claim 11, wherein:

N is 10;

M is 2;

said means for applying an input signal comprises a means for connecting one of said 2 stationary electrodes, which are in confronting relationship to said rotary electrode, to said input signal; and said means for connecting said amplifier comprises a means for connecting the other of said 2 stationary electrodes to said amplifier.

13. An apparatus according to claim 12, wherein each of alternate 5 stationary electrodes (A, B, C, D, E) among said 10 stationary electrodes is connected to the third stationary electrode from that stationary electrode, respectively, in the same direction;

said rotary electrode is in confronting relationship to 2 stationary electrodes which are next to each other;

said means for applying an input signal comprises a means for connecting one of said 2 stationary electrodes which are in confronting relationship to said rotary electrode to said input signal through one of said 5 stationary electrodes; and said means for connecting said amplifier comprises a means for connecting the other stationary electrode of said 2 stationary electrodes to said amplifier through one of the remaining 4 stationary electrodes except the one connected to said input signal among said 5 stationary electrodes (A, B, C, D, E).

14. An apparatus according to one of claims 8–13, wherein said means for converting said analog output signal into a digital signal includes means for selecting the central few cycles among said P cycles of said analog output signal and converting said few cycles into a digital signal.

* * * * *